(12) United States Patent
Fukuoka et al.

(10) Patent No.: US 10,297,744 B2
(45) Date of Patent: May 21, 2019

(54) PIEZOELECTRIC CERAMIC PLATE, PLATE-SHAPED SUBSTRATE AND ELECTRONIC COMPONENT

(71) Applicant: KYOCERA Corporation, Kyoto-shi, Kyoto (JP)

(72) Inventors: Shuichi Fukuoka, Kirishima (JP); Tomonori Eguchi, Kagoshima (JP); Hitoshi Nakakubo, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 212 days.

(21) Appl. No.: 15/032,422

(22) PCT Filed: Aug. 29, 2015

(86) PCT No.: PCT/JP2015/074549
§ 371 (c)(1),
(2) Date: Apr. 27, 2016

(87) PCT Pub. No.: WO2016/031994
PCT Pub. Date: Mar. 3, 2016

(65) Prior Publication Data
US 2016/0254436 A1    Sep. 1, 2016

(30) Foreign Application Priority Data

Aug. 29, 2014    (JP) ................................. 2014-175767

(51) Int. Cl.
*H01L 41/04*    (2006.01)
*H01L 41/187*    (2006.01)
(Continued)

(52) U.S. Cl.
CPC ........ *H01L 41/1876* (2013.01); *C04B 35/493* (2013.01); *C04B 35/62645* (2013.01);
(Continued)

(58) Field of Classification Search
CPC ............. H01L 41/1876; H01L 41/0471; H01L 41/0475
(Continued)

(56) References Cited

U.S. PATENT DOCUMENTS 5,402,791 A    4/1995  Saitoh et al.
7,948,153 B1 *  5/2011  Kellogg .............. H01L 41/1136
                                                310/329
(Continued)

FOREIGN PATENT DOCUMENTS

CN    1702057 A    11/2005
CN    102531638 A   7/2012
(Continued)

OTHER PUBLICATIONS

Extended European Search Report, European Patent Application No. 15835045.4, dated Oct. 24, 2017, 13 pgs.
(Continued)

*Primary Examiner* — Derek J Rosenau
(74) *Attorney, Agent, or Firm* — Volpe and Koenig, P.C.

(57) ABSTRACT

A piezoelectric ceramic plate which is slightly deformed by firing, includes a plate-shaped substrate, and an electronic component. The piezoelectric ceramic plate has a pair of main surfaces, a pair of opposing first side surfaces, and a pair of opposing second side surfaces. The pair of first side surfaces are baked surfaces, and the distance between the pair of first side surfaces measured at the center in the longitudinal direction is denoted by Lc and the distance between the pair of first side surfaces measured at ends in the longitudinal direction is denoted by Le. The ratio of the difference ΔL between Le and Lc to Lc (ΔL/Lc) is 1.0% or less. The piezoelectric ceramic plate is suitably used as a piezoelectric ceramic plate having an area of each of the main surfaces of 360 mm$^2$ or more and a thickness of 150 μm or less.

7 Claims, 8 Drawing Sheets

(51) Int. Cl.
*C04B 35/493* (2006.01)
*H01L 41/43* (2013.01)
*H01L 41/297* (2013.01)
*H01L 41/047* (2006.01)
*H01L 41/277* (2013.01)
*C04B 35/626* (2006.01)
*H01L 41/083* (2006.01)
*H01L 41/273* (2013.01)

(52) U.S. Cl.
CPC ...... *H01L 41/0471* (2013.01); *H01L 41/0475* (2013.01); *H01L 41/277* (2013.01); *H01L 41/297* (2013.01); *H01L 41/43* (2013.01); *C04B 2235/3203* (2013.01); *C04B 2235/3213* (2013.01); *C04B 2235/3215* (2013.01); *C04B 2235/3251* (2013.01); *C04B 2235/3279* (2013.01); *C04B 2235/3281* (2013.01); *C04B 2235/3284* (2013.01); *C04B 2235/3294* (2013.01); *C04B 2235/3298* (2013.01); *C04B 2235/3409* (2013.01); *C04B 2235/36* (2013.01); *C04B 2235/365* (2013.01); *C04B 2235/5445* (2013.01); *C04B 2235/5463* (2013.01); *C04B 2235/6025* (2013.01); *C04B 2235/77* (2013.01); *C04B 2235/786* (2013.01); *C04B 2235/80* (2013.01); *C04B 2235/85* (2013.01); *H01L 41/083* (2013.01); *H01L 41/273* (2013.01)

(58) Field of Classification Search
USPC ........................................................ 310/368
See application file for complete search history.

(56) References Cited

U.S. PATENT DOCUMENTS

| 2002/0084724 A1* | 7/2002 | Morinaga | H03H 9/177 |
| | | | 310/366 |
| 2004/0222719 A1 | 11/2004 | Sasaki et al. | |
| 2004/0262037 A1* | 12/2004 | Shizuno | H01L 41/083 |
| | | | 174/261 |
| 2009/0200898 A1 | 8/2009 | Sakaki et al. | |
| 2014/0068904 A1* | 3/2014 | Ebigase | H01L 41/1876 |
| | | | 29/25.35 |

FOREIGN PATENT DOCUMENTS

| DE | 4127829 A1 | 3/1993 |
| EP | 1547989 A1 | 6/2005 |
| EP | 2833424 A1 | 2/2015 |
| JP | 03-054878 A | 3/1991 |
| JP | 04-298085 A | 10/1992 |
| JP | 04-325464 A | 11/1992 |
| JP | 05-055661 A | 3/1993 |
| JP | 07-045124 A | 2/1995 |
| JP | 2000-086341 A | 3/2000 |
| JP | 2010-222170 A | 10/2010 |
| JP | 2011-029537 A | 2/2011 |
| JP | 2011-068535 A | 4/2011 |
| JP | 2011-241105 A | 12/2011 |
| JP | 2013-211350 A | 10/2013 |
| WO | 2004/026789 A1 | 4/2004 |
| WO | 2013/146975 A1 | 10/2013 |

OTHER PUBLICATIONS

International Search Report, PCT/JP2015/074549, dated Dec. 1, 2015, 2 pgs.
Chinese Office Action with English concise explanation, Chinese Patent Application No. 201580002390.9, dated Jan. 16, 2017, 13 pgs.
J. Bi et al., "Processing and Properties of Special Ceramics," Materials Science and Engineering series, Harbin Institute of Technology Press, Mar. 2008, 3 pgs. with English translation.
Extended European Search Report, European Patent Application No. 15835935.6, dated Jul. 24, 2017, 9 pgs.
Chinese Office Action with English concise explanation, Chinese Patent Application No. 201580002303.X, dated Jan. 9, 2017, 10 pgs.
International Search Report, PCT/JP2015/074551, dated Dec. 1, 2015, 1 pg.

* cited by examiner

PIEZOELECTRIC CERAMIC PLATE, PLATE-SHAPED SUBSTRATE AND ELECTRONIC COMPONENT

TECHNICAL FIELD

The present invention relates to a piezoelectric ceramic plate, a plate-shaped substrate, and an electronic component.

BACKGROUND ART

Piezoelectric ceramic plates are used for a variety of electronic components, such as a piezoelectric actuator, which utilize, as a mechanical driving source, displacement or force generated via a piezoelectric phenomenon. With broadened use of piezoelectric actuators, multi-layer piezoelectric actuators from which larger displacement or larger generated force can be obtained at lower voltages have become increasingly used.

Since conventional piezoelectric ceramic plates develop significant deformation (variation in shrinkage) after firing, such piezoelectric ceramic plates are subjected to processing, such as cutting and polishing, after firing in order to control the shape and dimensions of the piezoelectric ceramic plates into prescribed ranges (see, for example, Patent Literature 1).

PRIOR ART DOCUMENT

Patent Document

Patent DOCUMENT 1: Japanese Unexamined Patent Publication No. 3-54878

SUMMARY OF THE INVENTION

Problems to be Solved by the Invention

Conventionally, however, there is a problem that the number of steps increases and the manufacturing cost also increases because cutting, polishing or the like is performed after firing in order to control the shape and dimensions of a piezoelectric ceramic plate into prescribed ranges.

It is an object of the present invention to provide a piezoelectric ceramic plate and a plate-shaped substrate which are capable of reducing processing after firing, and an electronic component.

Means for Solving the Problems

The piezoelectric ceramic plate of the present invention is a piezoelectric ceramic plate having a pair of quadrangular main surfaces, a pair of first side surfaces opposing each other, and a pair of second side surfaces opposing each other, wherein the pair of first side surfaces are baked surfaces, and where the distance between the pair of first side surfaces measured at the center in the longitudinal direction of the first side surfaces is denoted by Lc and the distance between the pair of first side surfaces measured at ends in the longitudinal direction of the first side surfaces is denoted by Le, the ratio of the difference $\Delta L$ between Le and Lc to Lc ($\Delta L/Lc$) is 1.0% or less.

The piezoelectric ceramic plate of the present invention is a piezoelectric ceramic plate having a pair of quadrangular main surfaces, a pair of first side surfaces opposing each other, and a pair of second side surfaces opposing each other, wherein the area of each of the main surfaces is 360 mm$^2$ or more, and the pair of first side surfaces are baked surfaces.

The plate-shaped substrate of the present invention has an internal electrode within a piezoelectric ceramic plate.

The electronic component of the present invention is an electronic component including a surface electrode disposed on a surface of the plate-shaped substrate mentioned above, and a via hole conductor connected to the internal electrode, extending in the thickness direction of the piezoelectric ceramic plate, and led to the surface of the plate-shaped substrate, wherein the pair of second side surfaces of the piezoelectric ceramic plate are baked surfaces.

The electronic component of the present invention is an electronic component including the plate-shaped substrate mentioned above, and an external electrode disposed on each of the second side surfaces of the piezoelectric ceramic plate and connected to the internal electrode, wherein the electronic component has a processed surface as each of the second side surfaces of the piezoelectric ceramic plate, and the external electrode is disposed on the processed surface.

Effect of Invention

With the piezoelectric ceramic plate of the present invention, processing after firing can be reduced. In addition, with the plate-shaped substrate and the electronic component of the present invention, the manufacturing cost can be reduced.

BRIEF DESCRIPTION OF THE DRAWINGS

FIG. 1 shows a piezoelectric ceramic plate.

FIG. 3 schematically illustrates a first embodiment of an electronic component.

FIG. 5 schematically illustrates a second embodiment of an electronic component.

EMBODIMENTS FOR CARRYING OUT THE INVENTION (Piezoelectric Ceramic Plate)

Figure 1A:
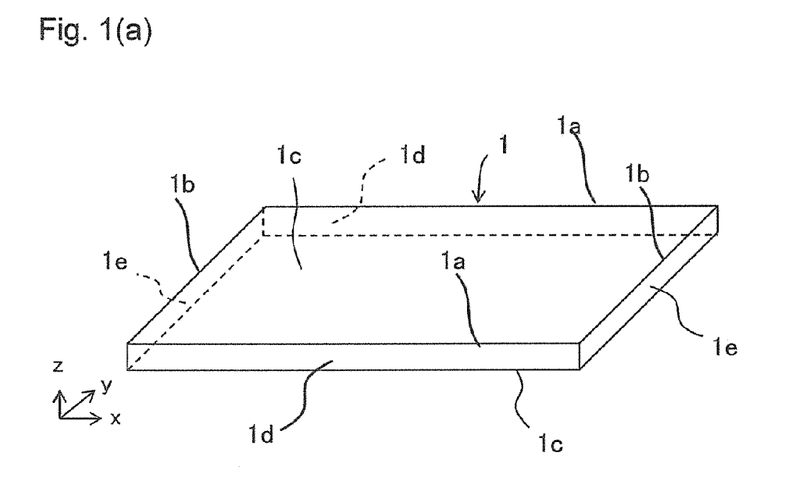
FIG. 1(a) is a perspective view and FIG. 1(b) is a scanning electron microscope (SEM) photograph of a surface extending from a first side surface to a main surface.

FIG. 1(a) illustrates a piezoelectric ceramic plate 1 of this embodiment. This piezoelectric ceramic plate 1 has a pair of rectangular main surfaces 1 each having a pair of approximately parallel sides 1a opposing each other and another pair of sides 1b, a pair of first side surfaces 1d opposing each other, and a pair of second side surfaces 1e opposing each other. The sides constituting the pair of first side surfaces 1d and located on the sides of the main surfaces 1c are sides 1a of the main surfaces 1c. Thus, the pair of first side surfaces 1d are approximately parallel to each other.

Figure 1B:
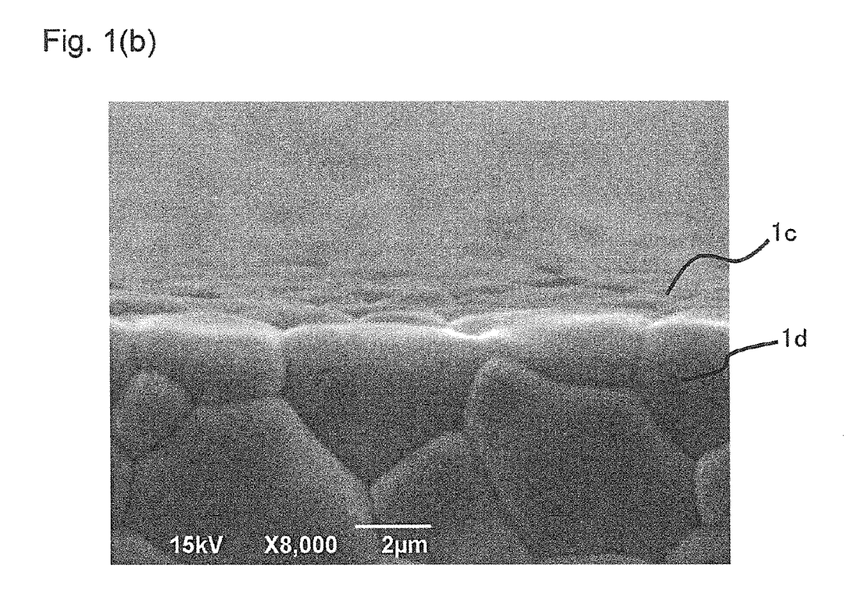

The pair of first side surfaces 1d are baked surfaces as illustrated in FIG. 1 (b). FIG. 1 (b) is a SEM photograph for observing the surface of the piezoelectric ceramic plate 1 from obliquely above the main surface 1c so that the first side surface 1d and the main surface 1c could be confirmed.

The term "baked surface" refers to a surface that has not been processed after firing as illustrated in FIG. 1 (b) and that is constituted of crystal grains (ceramic grains) with rounded corners. In this embodiment, the pair of second side surfaces 1e and the pair of main surfaces 1c are also baked surfaces, and all the circumferences are baked surfaces.

Figure 2A:
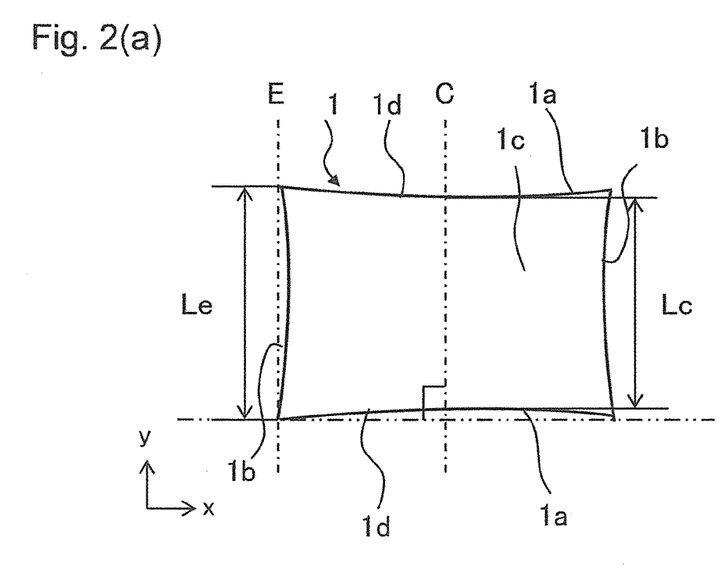
FIG. 2(a) is an explanatory view about the amount of deformation of a piezoelectric ceramic plate the main surface of which has a rectangular shape.

As illustrated in FIG. 2 (a), where the distance between the pair of first side surfaces 1d measured at the center in the longitudinal direction (the x-axis direction) of the first side surfaces 1d is denoted by Lc and the distance between the pair of first side surfaces 1d measured at ends in the longitudinal direction (the x-axis direction) of the first side surfaces 1d is denoted by Le, the ratio of the difference ΔL between Le and Lc to Lc (ΔL/Lc) is 1.0% or less. In particular, ΔL/Lc is 0.4% or less, even 0.2% or less, and still 0.1% or less. The difference ΔL is a value obtained by subtracting the shorter one from the longer one so as to be positive. The distance between the first side surfaces 1d can be measured, for example, with a caliper or an image size measuring device (for example, a CNC image measuring device).

Specifically, as shown by a two-dot chain line in FIG. 2 (a), a straight line connecting both ends of one side 1a of the main surface 1c of the piezoelectric ceramic plate 1 is drawn, a perpendicular C (dashed dotted line) is drawn to the middle point between both the ends located on that straight line, intersections of the perpendicular C with the pair of sides 1a of the main surface 1c are determined, and then the distance between the intersections is denoted by Lc. On the other hand, a line E located at either one of both the ends of one side 1a and parallel to the perpendicular C is drawn, intersections of the line E with the pair of sides 1a are determined, and then the distance between the intersections is denoted by Le.

Since the piezoelectric ceramic plate 1 of this embodiment has a ΔL/Lc of 1.0% or less, it can be controlled to have a prescribed shape and prescribed dimensions without performing any processing such as cutting and polishing, so that a piezoelectric ceramic plate 1 accurate in shape and dimensions can be easily obtained and the manufacturing cost can be reduced. Moreover, because of omission of processing after firing, breakage such as chipping and fracture of a thin piezoelectric ceramic plate 1 can be reduced.

Figure 2B:
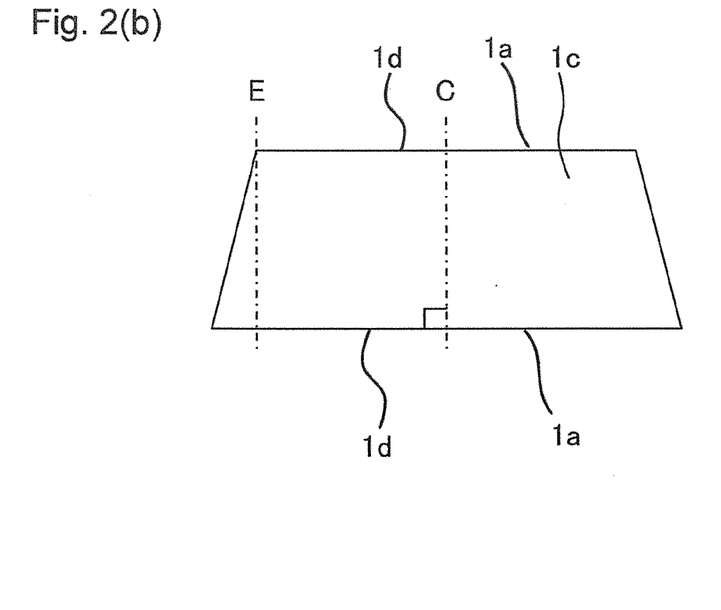
FIG. 2(b) is an explanatory view about the amount of deformation of a piezoelectric ceramic plate the main surface of which has a trapezoidal shape.

Although FIG. 1 shows a piezoelectric ceramic plate 1 having a pair of rectangular main surfaces 1c, a piezoelectric ceramic plate 1 having a pair of trapezoidal main surfaces 1c may of course be available as illustrated in FIG. 2 (b). Le and Lc in this case are determined by drawing a straight line connecting both ends of the shorter one of a pair of sides 1a of the main surface 1c, then drawing a perpendicular C (dashed dotted line) to the middle point on that straight line located between both ends of the side 1a, and then drawing a line E located at either one of both ends of one side 1a and parallel to the perpendicular C.

The pair of main surfaces 1c do not have to be baked surfaces although the case where they are baked surfaces is shown in FIG. 1. Employing baked surfaces also as the pair of main surfaces 1c eliminates the necessity of processing the main surfaces 1c of the piezoelectric ceramic plate 1 after firing.

The piezoelectric ceramic plate 1 is preferably one having a (ΔL/L) of 1.0% or less even when the area of the main surface 1c is 360 mm² or more, and further having a (ΔL/Lc) of 1.0% or less even when the area of the main surface 1c is 1000 mm² or more. The area of the main surface 1c can be determined as the product of Lc and the distance between both ends of the side 1a. When the piezoelectric ceramic plate 1 has no internal electrodes, it preferably has a (ΔL/Lc) of 1.0% or less even when the thickness thereof is 50 μm or less, even 30 μm or less in the event that the main surface 1c is as wide in area as described above.

(Plate-Shaped Substrate, Electronic Component)

Figure 3A:
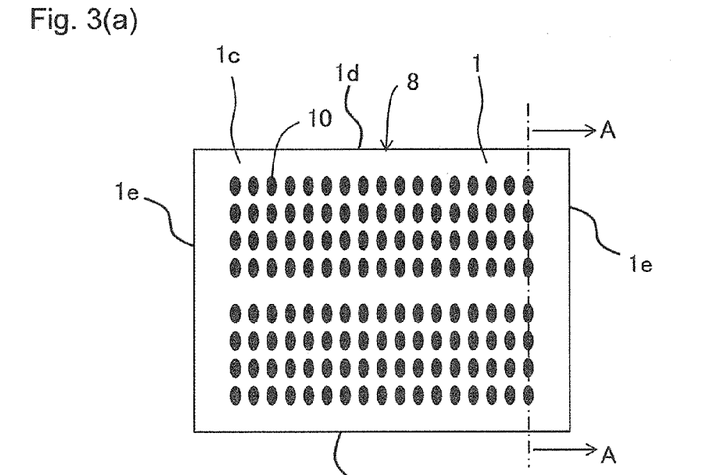
FIG. 3(a) is a schematic plan view.
Figure 3B:
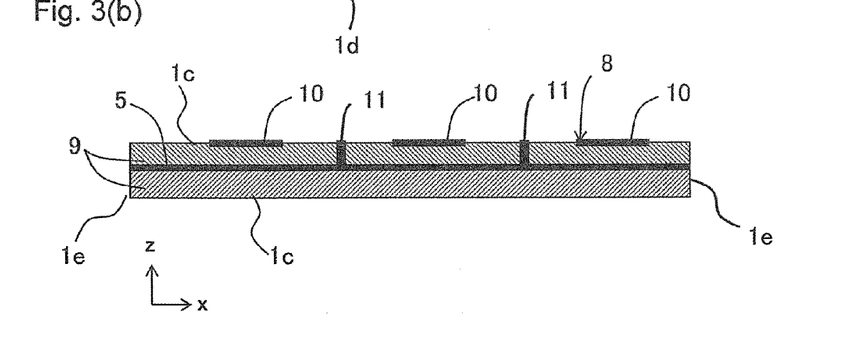
FIG. 3(b) is a cross-sectional view of FIG. 3(a) along line A-A.

FIG. 3 illustrates a first embodiment of an electronic component, and this electronic component has a plate-shaped substrate 8 having an internal electrode 5 in a piezoelectric ceramic plate 1. In addition, the electronic component has a plurality of surface electrodes 10 formed on the surface of the plate-shaped substrate 8, and a via hole conductor 11 connected to the internal electrode 5, extending in the thickness direction of the piezoelectric ceramic plate 1 (the z-axis direction), and led to the surface of the plate-shaped substrate 8, and the piezoelectric ceramic plate 1 has a pair of second side surfaces 1e each being a baked surface.

That is, in this embodiment, the first side surfaces 1d and the second side surfaces 1e of the piezoelectric ceramic plate 1 are baked surfaces, and the main surfaces 1c of the piezoelectric ceramic plate 1 are also baked surfaces. While the side surfaces 1d and 1e of the piezoelectric ceramic plate 1 are formed of side surfaces of two piezoelectric layers 9, it is not discernible to the naked eye, and the two layers together form the side surfaces 1d and 1e of the piezoelectric ceramic plate 1. Since the internal electrodes 5 serve as the boundaries between the piezoelectric layers 9, the number of the piezoelectric layers 9 stacked can be counted on the basis of the number of the internal electrodes 5 stacked.

In such an electronic component, voltage is applied between a surface electrode 10 and an internal electrode 5 via a via hole conductor 11 led to the surface of the plate-shaped substrate 8 and the surface electrode 10. In FIG. 3(a), via hole conductors 11 are omitted.

The size of the main surface 1c of the piezoelectric ceramic plate 1 is 360 mm² or more, or even 1000 mm² or more, and the thickness of the piezoelectric ceramic plate 1 having the internal electrode 5 is 150 μm or less, 100 μm or less, 60 μm or less, or even 50 μm or less.

Also in this embodiment, the (ΔL/Lc) is 1.0% or less. The (ΔL/Lc) is determined by measuring the distance between the pair of first side surfaces 1d of the piezoelectric ceramic plate 1 as illustrated in FIG. 2 with a caliper, an image size measuring device, or the like.

When, for example, a 40 μm thick electronic component with a size of 40 mm×30 mm is produced using a conventional piezoelectric ceramic plate, its ΔL is several hundred micrometers or more at the time of firing up, and processing is required after the firing. On the other hand, in the case of an electronic component including the piezoelectric ceramic plate 1 of this embodiment, the ΔL is 200 μm or less and the distance between the first side surfaces 1d after firing of the piezoelectric ceramic plate 1 satisfies the condition that ΔL/Lc is 1.0% or less, and processing is not required after firing. Accordingly, since the electronic component of this embodiment is slightly deformed by firing, an electronic component with a desired shape and desired dimensions can be obtained without being processed after firing and the manufacturing cost can be reduced. Fracture, chipping, and so on caused by processing can also be reduced.

Figure 4:
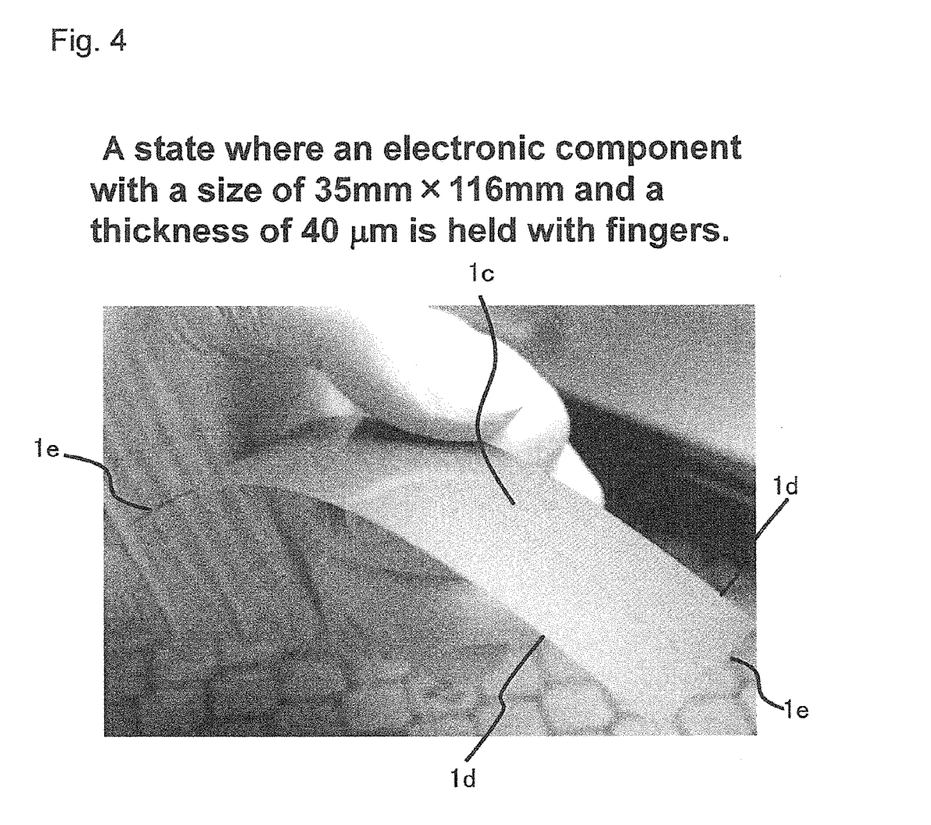
FIG. 4 is a photograph of a state where an electronic component is held by hand.

The electronic component may have three or more piezoelectric layers 9 and two or more layers of internal electrodes 5. FIG. 4 shows a state where an electronic component with a size of 35 mm×116 mm and a thickness of 40 μm is held with fingers.

Figure 5A:
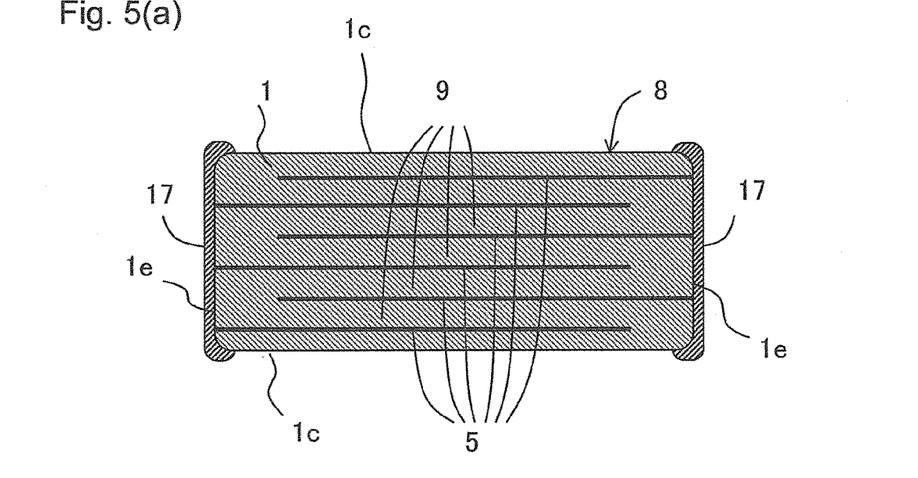
FIG. 5(a) is a schematic longitudinal cross-sectional view.

FIG. 5 illustrates a second embodiment of an electronic component, which has a plate-shaped substrate 8 and a pair of external electrodes 17 which are disposed on opposing second side surfaces 1e of the piezoelectric ceramic plate 1 and connected alternately to internal electrodes 5. The pair of second side surfaces 1e on which the external electrodes 17 of the piezoelectric ceramic plate 1 are disposed are processed surfaces. The external electrodes 17 are disposed on these processed surfaces, and the internal electrodes 5 and the external electrodes 17 are connected together. The processed surface is a surface resulting from processing of a baked surface, and may be a cut surface, a polished surface or the like.

While the entire pair of second side surfaces 1e of the piezoelectric ceramic plate 1 may be processed surfaces, for example, it is also possible that only a limited part of the second side surfaces 1e is processed surfaces such that a part of the second side surfaces 1e on which external electrodes 17 are to be disposed is processed surfaces.

On the other hand, the pair of first side surfaces 1d of the piezoelectric ceramic plate 1 on which no external electrodes 17 are disposed are baked surfaces.

Figure 5B:
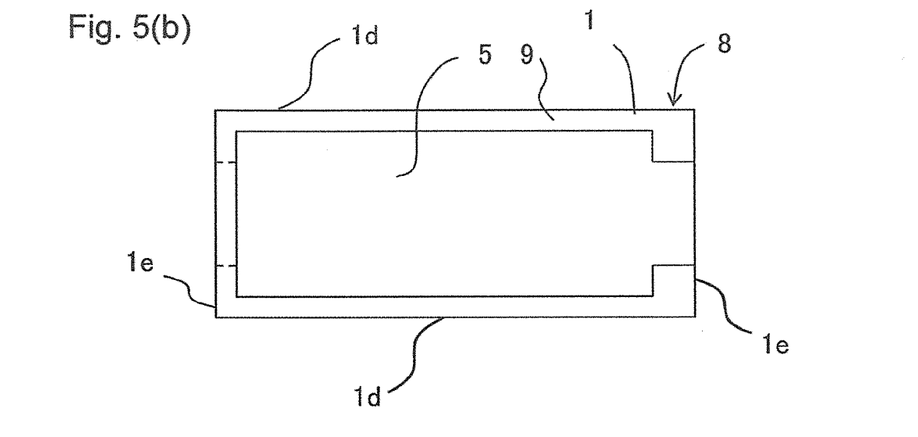
FIG. 5(b) is a schematic transverse cross-sectional view.

The internal electrode 5 is configured as a partial electrode formed on a part of the piezoelectric layer 9 as illustrated in FIG. 5(b), and a part of the internal electrode 5 is exposed in a second side surface 1e of the piezoelectric ceramic plate 1 and is connected to an external electrode 17.

Like the electronic component of FIG. 3, the distance between the first side surfaces 1d, which are baked surfaces, of the piezoelectric ceramic plate 1 satisfies the condition that ΔL/Lc is 1.0% or less. This can eliminate the necessity of processing the first side surfaces 1d of the piezoelectric ceramic plate 1, and easily affords an electronic component accurate in shape and dimensions, and also can reduce the manufacturing cost.

In the electronic components of FIGS. 3 and 5, the internal electrodes 5 contain Ag as a main component and may contain Pd within a range of up to 35% by mass, even within a range of up to 30% by mass in addition to Ag.

(Piezoelectric Ceramic Plate Material)

Figure 6:
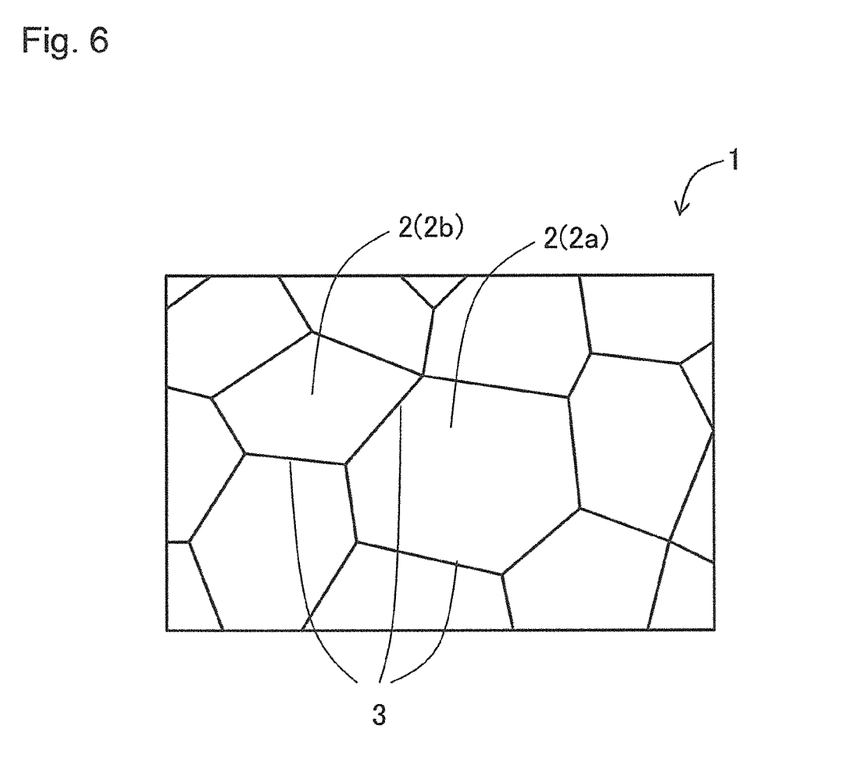
FIG. 6 is an explanatory view illustrating tissue structure of a piezoelectric layer.

The piezoelectric ceramic plate 1 (piezoelectric layer 9) is a material including a plurality of crystal grains 2 containing a lead zirconate titanate-type crystal (henceforth also simply referred to as a PZT-type crystal) containing Zn and Bi, and crystal grain boundaries 3 existing between the crystal grains 2 as illustrated in FIG. 6, or alternatively, it may be a material consisting of the crystal grains 2 and the crystal grain boundaries 3.

The crystal grains 2 desirably include crystal grains 2 in which Ci is less than Cb(Ci<Cb) in local elemental analysis performed at the inside of the crystal grain 2 and at an area including the crystal grain boundary 3 (henceforth sometimes referred to as "on a crystal grain boundary 3") both located in a cross section of the piezoelectric ceramic plate 1, followed by comparison of the content Ci of at least one element of Zn and Bi at the inside of the crystal grain 2 with the content Cb thereof at the crystal grain boundary 3 adjoining the crystal grain 2.

Regarding at least one element of Zn and Bi, a crystal grain 2 in which Ci is less than Cb is called a "firstcrystal grain 2a" and a crystal grain 2 in which there is no difference between Ci and Cb for both Zn and Bi or Ci is greater than Cb(Ci≥Cb) is called a "second crystal grain 2b." In other words, the first crystal grain 2a is a crystal grain in which the content of at least one of Zn and Bi is greater on the crystal grain boundary 3 than that at the inside of the first crystal grain 2a in local elemental analysis performed at the inside of the first crystal grain 2a and on the crystal grain boundary 3 adjoining the first crystal grain 2a, followed by comparison of their content of Zn and Bi.

Unlike conventional PZT-type piezoelectric ceramic plates, in the piezoelectric ceramic plate 1, the crystal grain boundaries 3 contain substantially no amorphous phase containing Li, B or the like, which is a component to accelerate sintering, or substantially no crystal phase other than PZT-type crystals (heterogeneous phase). Accordingly, the piezoelectric ceramic plate 1 is small in change with time of insulation resistance and deterioration of piezoelectric properties both caused by persistence of those phases.

The content of Zn and Bi at the inside of the crystal grain 2 and that at the crystal grain boundary 3 can be determined, for example, by observing a cross section of the piezoelectric ceramic plate 1 with a scanning electron microscope (SEM) or a transmission electron microscope (TEM), and then performing local elemental analysis of Zn and Bi at the inside of the crystal grain 2 and at the crystal grain boundary 3 adjoining the crystal grain 2.

The local elemental analysis may be performed, for example, by using energy dispersive X-ray spectroscopy (EDS), a field emission electron probe micro analyzer (FE-EPMA), Auger electron spectrometry (AES), a transmission electron microscope (TEM), or the like. Herein, the content of Zn and Bi at the inside of the crystal grain 2 means, for example, the content of Zn and Bi detected by elemental analysis of the center (area centroid of a cross section) of the crystal grain 2, and the content of Zn and Bi in an area including crystal grain boundaries 3 means the content of Zn and Bi detected by elemental analysis of the crystal grain boundary 3 of the crystal grain 2 and a vicinity thereof.

The above-mentioned elemental analyzers differ in spatial resolution; for example, when a transmission electron microscope (TEM) is used, its spatial resolution is a few nanometers, and when Auger electron spectrometry (AES) is used, its spatial resolution is several tens of nanometers. Therefore, the measurement performed on the crystal grain boundary 3 substantially results in the comparison of the result measured at the crystal grain boundary 3 and a vicinity thereof as far as a few nanometers (TEM) or a several tens of nanometers (AES) with the result measured at the center of the crystal grain 2. Although the center (the area centroid of a cross section) of the crystal grain 2 has been taken as an example of a measurement point of the inside of the crystal grain 2, an area where the distance from the crystal grain boundary 3 is equal to or greater than the spatial resolution of an elemental analyzer in the crystal grain 2 may be analyzed and assessed as the inside of the crystal grain 2 when an elemental analyzer with high spatial resolution, such as a TEM, is used.

The piezoelectric ceramic plate 1 of this embodiment includes a crystal grain boundary 3 with a thickness of 10 nm or less (about 1 to 5 nm), and it is expected that the elemental analysis performed on the crystal grain boundary 3 includes information of the inside of a crystal grain 2 at least a few nanometers away from the crystal grain boundary 3, namely, information of a vicinity of the crystal grain boundary 3 of the crystal grain 2, which is at the very surface of the crystal grain 2. In other words, it is expected that the first crystal grain 2a in the piezoelectric ceramic plate 1 of this embodiment has a layer that is rich in at least one of Zn and Bi at the immediate vicinity of the crystal grain boundary 3 (in the vicinity of the surface of the crystal grain 2) and the thickness of the layer is expected to be a few nanometers. Accordingly, the area including a crystal grain boundary 3 as referred to herein shall include a surface layer of a crystal grain 2 extending within a few nanometers from the crystal grain boundary 3.

The measurement of elemental analysis can be performed, for one crystal grain 2, at least at one point within the crystal grain 2 and at one point within an area including a crystal grain boundary 3 (a grain boundary located between two planes or a triple point) located closest to the measurement point within the crystal grain 2, followed by comparison of the measurements.

When the Zn content within the crystal grain 2 is denoted by Ci (Zn) and the Zn content in the area including a crystal grain boundary 3 adjoining the crystal grain 2 is denoted by Cb(Zn), it is preferable in the first crystal grain 2a that the ratio of Cb(Zn) to Ci (Zn) (Cb(Zn)/Ci (Zn)) is not less than 1.04 and not more than 2.0 in mass ratio.

Moreover, when the Bi content within the crystal grain 2 is denoted by Ci(Bi) and the Bi content in the area including a crystal grain boundary 3 adjoining the crystal grain 2 is denoted by Cb(Bi), it is preferable in the first crystal grain 2a that the ratio of Cb(Bi) to Ci(Bi) (Cb(Bi)/Ci(Bi)) is 1.03 or more, even 1.05 or more, in mass ratio. Such ratios make it possible to achieve densification at low temperature. (Cb(Bi)/Ci(Bi)) is preferably 2.0 or less, even 1.8 or less, in mass ratio.

The percentage of the first crystal grains 2a is preferably 80% or more of the crystal grains 2 constituting the piezoelectric ceramic plate 1 as expressed by the ratio of the number of the first crystal grains 2a to the total number of the first crystal grains 2a and the second crystal grains 2b (henceforth referred to as the number of the crystal grains 2). Adjusting the percentage of the first crystal grains 2a to 80% or more or even 90% or more affords a piezoelectric ceramic plate 1 that slightly deforms even if it is densified in a thin shape and contains a small amount of amorphous phase or heterogeneous phase.

The percentage of the first crystal grains 2a in the crystal grains 2 composed of the first crystal grains 2a and the second crystal grains 2b can be determined by extracting at least 10 arbitrary crystal grains 2 through observation of a cross section of the piezoelectric ceramic plate 1 with a scanning electron microscope (SEM) or a transmission electron microscope (TEM), performing local elemental analysis of Zn and Bi at the inside of the crystal grains 2 and crystal grain boundaries 3 adjoining the crystal grains 2, and calculating the ratio of the number of the first crystal grains 2a to the number of the crystal grains 2 measured.

The piezoelectric ceramic plate 1 of this embodiment is preferably composed of PZT-type crystal grains 2 and crystal grain boundaries 3 existing between the crystal grains 2, and preferably contains substantially no crystal phase other than the PZT-type crystal, that is, a crystal phase poor in piezoelectric properties or insulation resistance, in terms of maintaining stable insulation resistance or stable piezoelectric properties. The phrase "substantially no crystal phase other than the PZT-type crystal (henceforth referred to as a heterogeneous phase) is contained" means that no heterogeneous phase is found in a lattice image with a transmission electron microscope (TEM) or that in X-ray diffraction (XRD) measurement of a cross section of the piezoelectric ceramic plate 1 using a Cuk$\alpha$ ray, only peaks derived from the PZT-type crystal are observed and there are substantially no other peaks derived from heterogeneous phases.

The phrase "there are substantially no peaks derived from heterogeneous phases other than the PZT-type crystal in X-ray diffraction measurement using a Cuk$\alpha$ ray" means that the diffraction peak intensity of the heterogeneous phases is 3 or less when the diffraction peak intensity of (111) of the PZT-type crystal is taken as 100. In a diffraction profile obtained as a result of X-ray diffraction (XRD) measurement, a tangent line is drawn at both sides of a diffraction peak and the diffraction peak intensity is expressed by the length to the peak in a direction perpendicular to the tangent line. If the peak intensity of crystal phases other than PZT-type crystal phases low in piezoelectric properties or insulation resistance (heterogeneous phases) is 3 or less relative to the diffraction peak intensity of (111) of the PZT-type crystal when the diffraction peak intensity of (111) of the PZT-type crystal is taken as 100, the piezoelectric ceramic plate 1 is not affected greatly with respect to its piezoelectric properties and can be suitably used.

The piezoelectric ceramic plate 1 of this embodiment preferably contains substantially no alkali metal element such as Li and Na and substantially no B (boron). If an alkali metal element, such as Li and Na, and B (boron) are added when firing a PZT-type crystal at low temperature, a liquid phase is formed and sintering properties are improved. However, amorphous phases or crystal phases other than the PZT-type crystal remain in crystal grain boundaries 3 of crystal grains 2 of the PZT-type crystal, and accordingly insulation resistance may decrease with time or piezoelectric properties may deteriorate. In some cases, the alkali metal element, such as Li and Na, and B (boron) may inevitably be contained as impurities in the piezoelectric ceramic plate 1. Accordingly, the phrase "substantially no alkali metal element, such as Li and Na, and substantially no B (boron) are contained" means that these elements are not added positively during the process of manufacturing the piezoelectric ceramic plate 1.

In terms of denseness, the piezoelectric ceramic plate 1 of this embodiment preferably has a porosity of 0.25% or less. By forming such a dense piezoelectric ceramic plate 1, a density of 7.7 g/cm$^3$ or more, even 7.8 g/cm$^3$ or more is attained, and mechanical loss can be reduced, so that a piezoelectric ceramic plate 1 which is prone to little deterioration or variation of piezoelectric properties is obtained.

The average grain diameter of the crystal grains 2 in the piezoelectric ceramic plate 1 of this embodiment is preferably 1.0 to 4.0 μm. If the average grain diameter of the crystal grains 2 is excessively small, the piezoelectric properties deteriorate. If the average grain diameter is excessively large, the hysteresis becomes larger and the piezoelectric ceramic plate becomes prone to generate heat when driven as an electronic component. Adjusting the average grain diameter of the crystal grains 2 to a range of 1.0 to 4.0 μm makes it possible to maintain necessary piezoelectric properties and inhibit heat generation when the piezoelectric ceramic plate is driven as an electronic component.

The piezoelectric ceramic plate 1 includes the crystal grains 2 containing a lead zirconate titanate-type crystal containing Zn and Bi and the crystal grain boundaries 3. The crystal grains 2 are of a composite perovskite-type compound, and it is desirable that the crystal grains 2 contain Sb, Cu, Ni, and Nb in addition to Pb, Zr, Ti, Zn, and Bi as metal components, and it is desirable that the crystal grains 2 further contain at least one of Sr and Ba if needed.

The composition of the piezoelectric ceramic plate 1 is represented by a first component represented by the following composition formula and a second component composed of a Bi oxide and a Zn oxide. Here, M represents at least one element of Cu and Ni.

First component:

In the composition formula of the first component, x, y, a, b, and c satisfy the following relational expressions:

$0 \leq x \leq 0.14$, $0 \leq y \leq 0.14 (x+y \geq 0.04)$, $0.01 \leq a \leq 0.12$, $0 \leq b \leq 0.015$, and $0.42 \leq c \leq 0.58$.

When the mass ratio of the second component relative to 100% by mass of the first component is expressed as α %, α is not less than 0.1 and not more than 2.0. While α is defined as the total amount of Zn and Bi as the second component in terms of oxides (ZnO and $Bi_2O_3$, respectively), it may be an amount in terms of a composite oxide of Zn and Bi, such as $Bi_{38}ZnO_{58}$, $Bi_{38}ZnO_{60}$, $Bi_{48}ZnO_{73}$, and BiZnO. The ratio between Zn and Bi(Bi/Zn) in the second component is preferably $1 \leq (Bi/Zn) \leq 48$ in element ratio.

Here, the reason why x, y, a, b, c, and α are limited to the ranges recited above will be described. The reason why the amount of substitution of Sr for Pb, x, is limited as $0 \leq x \leq 0.14$ is that it is possible to keep the Curie temperature high by substituting a part of Pb by Sr. The reason why the amount of substitution of Ba for Pb, y, is limited as $0 \leq y \leq 0.14$ is that it is possible to maintain the Curie temperature high and obtain a high piezoelectric strain constant $d_{31}$ by substituting a part of Pb by Ba.

The reason why the amount of substitution of $(Zn_{1/3}Sb_{2/3})$ for Ti, a, is limited as $0.01 \leq a \leq 0.12$ is that it is possible to obtain a large piezoelectric strain constant $d_{31}$ and a large piezoelectric output constant $g_{31}$, to maintain the Curie temperature high, and to maintain a small dielectric loss. When the piezoelectric ceramic plate 1 of this embodiment is used as a piezoelectric actuator, a large piezoelectric strain constant can be obtained by setting a as $0.05 \leq a \leq 0.12$, and when it is used as a piezoelectric sensor, a large piezoelectric output constant $g_{31}$ can be obtained by setting a as $0.01 \leq a \leq 0.05$.

By limiting the amount of substitution of $(M_{1/3}Nb_{2/3})$ for Ti, b, as $0 \leq b \leq 0.015$, a large coercive electric field can be achieved while inhibiting drop of a piezoelectric d constant. While Ni and Cu are used as M, when Cu is used as M, a piezoelectric ceramic plate 1 with a large coercive electric field can be formed while maintaining a particularly high piezoelectric d constant, and deterioration in displacement can be inhibited. It is particularly preferable to limit b as $0.002 \leq b \leq 0.01$.

In a piezoelectric ceramic plate 1 containing PZT as a main component, there is an MPB (morphotropic phase boundary) that exhibits a maximum value of a piezoelectric strain constant when the solid solution ratio of $PbZrO_3$ to $PbTiO_3$ is varied. When the piezoelectric ceramic plate 1 of this embodiment is used as a piezoelectric actuator, this MPB and a composition close thereto are used. Since this MPB varies depending on the values of x, y, a, and b, the value of c was determined within a composition range where an MPB can be captured within the composition ranges of x, y, a and b.

The reason why the mass ratio α (%) of the second component (Zn oxide and Bi oxide) to the first component is adjusted to $0.1 \leq α \leq 2.0$ is that in this range, a Zn oxide and a Bi oxide form a liquid phase during firing to wet crystal grains 2 containing a PZT-type crystal, and the sintering properties are enhanced, so that the whole of the ceramic is sintered uniformly and warp and deformation can be reduced even with a plate-shaped piezoelectric ceramic plate 1 that is small in thickness and large in area, and Zn and Bi dissolve in a PZT-type crystal after sintering, so that piezoelectric properties can be improved. The ratio of Zn to Bi(Bi/Zn) is preferably adjusted to $1 \leq (Bi/Zn) \leq 48$ in element ratio. Use of such a ratio allows the second component to form a liquid phase at low temperature and makes it possible to achieve uniform sintering of the whole ceramic.

(Manufacturing Method)

The piezoelectric ceramic plate 1 of this embodiment can be prepared as follows. For example, a mixed material of a calcined powder of a PZT-type crystal containing a first component and a powder containing a second component (Zn oxide and Bi oxide) is formed into a sheet by a well-known sheet forming method and then fired at 900 to 1050° C. in the atmosphere. As to an electronic component, an internal electrode paste is applied to a green sheet to form an internal electrode pattern. A plurality of green sheets on which such an internal electrode pattern has been formed are stacked, and finally, a green sheet on which an internal electrode pattern has not been formed is stacked to form a plate-shaped substrate compact, which is then fired at 900 to 1050° C. in the atmosphere.

In the methods for producing the piezoelectric ceramic plate 1 and the electronic component, even if firing is performed at a low temperature of 900 to 1050° C., the second component (Bi oxide and Zn oxide) forms a liquid phase, for example, at a low temperature of about 750° C. and can fully wet crystal grains 2 of a PZT-type crystal at a temperature lower than the firing temperature. As a result of this, sintering properties can be improved and the entire piezoelectric ceramic plate 1 shrinks approximately uniformly, and Bi and Zn dissolve in the PZT-type crystal after sintering.

The piezoelectric ceramic plate 1 after sintering includes crystal grains 2 of the PZT-type crystal as depicted in FIG. 6, and it is desirable that first crystal grains 2a are included in the crystal grains 2.

A specific manufacturing method is described below. First, a calcined powder of a PZT-type crystal containing Zn is prepared, for example.

Specifically, for example, powders of PbO, $ZrO_2$, $TiO_2$, and ZnO as feedstock and, optionally, powders of $Sb_2O_3$, CuO, NiO, $Nb_2O_5$, $SrCO_3$, and $BaCO_3$ are weighed and mixed. Subsequently, the mixture is dehydrated, dried, and then calcined at a maximum temperature of 850 to 950° C. for 1 to 3 hours. The resulting calcined powder of the PZT-type crystal is a calcined powder including the first component. The calcined powder obtained is milled again with a ball mill or the like so as to bring the average grain diameter $D_{50}$ into a range of 0.5 to 0.7 μm, for example.

During the calcination step, it is preferable to adjust the degree of formation of a PZT-type crystal appropriately. As an index for indicating a PZT-type crystal, the peak intensity $I_1$ of a peak (101) ($2θ \approx 30°$) and the peak intensity $I_2$ of a peak (111) ($2θ \approx 38°$) of a PZT-type crystal are used. In the X-ray diffraction (XRD) measurement of a calcined powder using a CuKα ray, the intensity ratio of $I_2$ to $I_1$, $I_2/I_1$, is preferably adjusted to 0.130 to 0.160.

If $I_2/I_1$ of a calcined powder is within a range of 0.130 to 0.160, the formation of the PZT-type crystal advances appropriately, and the sintering properties are improved by the addition of the second component (Zn oxide and Bi oxide). Moreover, Zn and Bi are incorporated into a surface layer of the PZT-type crystal along with the grain growth during the sintering stage and they sinter in a temperature range of 900 to 1050° C. without remaining as liquid phase components.

On the other hand, when $I_2/I_1$ of the calcined powder is less than 0.130, the formation of a PZT-type crystal is insufficient and, accordingly, an effect of improving sintering properties may not be obtained even if the second component (Zn oxide and Bi oxide) is added. When $I_2/I_1$ of the calcined powder is larger than 0.160, the formation of a PZT-type crystal excessively advances and, accordingly, Zn and Bi may be difficult to dissolve in a surface layer of the PZT-type crystal even if the second component (Zn oxide and Bi oxide) is added.

The reason why the peak intensity $I_1$ of a peak (101) (2θ≈30°) and the peak intensity $I_2$ of a peak (111) (2θ≈38°) of a PZT-type crystal are used is that it is believed that other peaks vary in peak position or pattern profile with change of the degree of formation (crystal phase) whereas the peak (101) (2θ≈30°) and the peak (111) (2θ≈38°) only vary in the intensity ratio and do not vary in peak position or pattern profile even if the degree of formation is varied, and therefore these peaks are best suited to indicate the degree of formation of a PZT-type crystal.

Next, powders of the second component (Zn oxide and Bi oxide, for example, ZnO and $Bi_2O_3$) are weighed and mixed with a calcined powder of a PZT-type crystal. As to the second component, the respective powders thereof may be added to a calcined powder, or a mixed powder prepared by mixing only the second component powders beforehand may be added to a calcined powder. Moreover, it is also permitted to synthesize a composite oxide containing Zn and Bi (henceforth referred to as a BZ oxide) by calcining the second component and then add the composite oxide to a calcined powder. In the case where the BZ oxide is synthesized, the synthesis can be performed by mixing prescribed amounts of Zn oxide and Bi oxide, dehydrating and drying the resulting mixture, and then calcining the mixture, for example, in the air at 600 to 720° C. for 1 to 3 hours. The average grain diameter $D_{50}$ of the second component is preferably adjusted to a range of 0.5 to 0.7 μm, especially, so as to be smaller than the average grain diameter ($D_{50}$) of the calcined powder of a PZT-type crystal, by using a ball mill or the like.

The calcined powder of a PZT-type crystal to which the second component have been added is mixed with a binder, and then formed into a desired shape using a well-known forming method, such as press forming and sheet forming such as a doctor blade method.

The prepared compact is fired at 900 to 1050° C. in the atmosphere.

Conventionally, Li, B, and the like, which form a liquid phase, have been added in order to fire a PZT-type crystal at low temperature. A piezoelectric ceramic plate 1 prepared using such additives can be fired at low temperature, but its insulation resistance drops with time or its piezoelectric properties are deteriorated due to the presence of an amorphous phase or a crystal phase other than the PZT-type crystal in grain boundaries of crystal grains of the PZT-type crystal. Even if $Bi_2O_3$, which dissolves in a PZT-type crystal, is used, it is difficult to sinter the whole of a ceramic uniformly and, especially, a thin plate-shaped piezoelectric ceramic plate develops warp or deformation because the liquid phase formation temperature of $Bi_2O_3$ is relatively high, i.e. about 820° C.

The piezoelectric ceramic plate 1 of this embodiment exhibits great sintering properties and forms a dense material having a porosity of 0.25% or less and a density of 7.7 $g/cm^3$ or more even if it is fired at a low temperature of 900 to 1050° C. because a Zn oxide and a Bi oxide, which are a second component, form a liquid phase to wet crystal grains 2 of a PZT-type crystal. Moreover, Zn and Bi that have formed a liquid phase dissolve in a surface layer of the crystal grains 2 of the PZT crystal after the sintering, so that a piezoelectric ceramic plate 1 in which the thickness of crystal grain boundaries 3 is 10 nm or less (about 1 to 5 nm) is formed. Accordingly, the piezoelectric ceramic plate 1 is a material including first crystal grains 2a, namely, first crystal grains 2a being smaller in the content of at least one element of Zn and Bi than an area including crystal grain boundaries 3 at the inside of the crystal grains 2 of the PZT-type crystal, in other words, first crystal grains 2a having a layer rich in at least one of Zn and Bi in the vicinity of crystal grain boundaries 3 (the surface layer of the crystal grains 2) of the crystal grains 2 of the PZT-type crystal.

That is, the piezoelectric ceramic plate 1 is a material excellent in piezoelectric properties, which is composed of a plurality of crystal grains 2 of a PZT-type crystal and crystal grain boundaries 3 existing between the crystal grains 2, and in which first crystal grains 2a are included in the crystal grains 2 and substantially no crystal phase other than the PZT-type crystal and substantially no amorphous phase are present at the crystal grain boundaries 3. With this piezoelectric ceramic plate 1, a volume resistivity of 1 GΩ·m or more is exhibited even after a lapse of 100 hours at 85° C., and insulation degradation during continuous driving can be inhibited.

The second component forms a liquid phase at about 750° C. and the whole of the ceramic starts sintering uniformly at the time of firing. Accordingly, deformation of the piezoelectric ceramic plate 1 during a sintering process tends to be inhibited even if the piezoelectric ceramic plate 1 is thin. The piezoelectric ceramic plate 1 of this embodiment is suitably used especially in an electronic component having a thickness of 150 μm or less, especially 50 μm or less.

The piezoelectric ceramic plate 1 can be used as various electronic components, such as a ceramic filter, an ultrasonic oscillator, a piezoelectric buzzer, a piezoelectric ignition unit, an ultrasonic motor, a piezoelectric fan, a piezoelectric sensor, and a piezoelectric actuator. For example, a piezoelectric actuator is an actuator utilizing displacement or power generated through a piezoelectric phenomenon as a mechanical driving source, and it is one of those that are recently attracting attention in the mechatronics field. A piezoelectric actuator is a solid element utilizing a piezoelectric effect, and it has distinguishing characteristics, such as less power consumption, greater response speed, larger amount of displacement, less heat generation, and smaller dimension and weight as compared with conventional electromagnetic actuators having a structure in which a coil is wound around a magnetic material. Especially, a multi-layer piezoelectric actuator from which larger displacement or larger generated force can be obtained at lower voltages is practically used for automatically focusing a camera for opening and closing a fuel injection valve of a vehicle-installed injector and as an acoustic component, such as a piezoelectric loudspeaker.

EXAMPLES

Example 1

Using powders of PbO, $ZrO_2$, $TiO_2$, ZnO, $Sb_2O_3$, $SrCO_3$, $BaCO_3$, CuO, and $Nb_2O_5$ as feedstock powders, the powders were weighed such that the first component might have the composition of Table 1 with the formula $Pb_{1-x-y}Sr_xBa_y$ $Ti_{1-a-b-c}$ $(Zn_{1/3}Sb_{2/3})_a$ $(M_{1/3}Nb_{2/3})_bZr_cO_3$, and then wet mixed with a ball mill for 24 hours. M is Cu or Ni. Subsequently, this mixture was dehydrated, dried, and then calcined at the calcination temperature shown in Table 1 for 3 hours, and the calcined material was wet ground again with a ball mill for 24 hours, thereby yielding a calcined powder having a $D_{50}$ of 0.5 to 0.7 μm.

Then, an additive having a $D_{50}$ of 0.5 to 0.7 μm shown in Table 1 was added in an amount (% by mass) shown in Table 1, expressed by a ratio relative to 100% by mass of the first component, and an organic binder was mixed therewith, and then a green sheet having a thickness of 30 μm was prepared using a doctor blade method. On the green sheet prepared was screen printed an internal electrode paste containing Ag and Pd, and 15 green sheets with an internal electrode paste printed thereon were stacked and a green sheet with no internal electrode paste printed thereon was stacked lastly. Thus, a plate-shaped substrate compact was prepared. The mass ratio between the metal components of the internal electrode paste was adjusted to Ag:Pd=95:5.

The plate-shaped substrate compact prepared was debindered and then fired in the atmosphere under the firing conditions shown in Table 1, followed by cooling. Thus, a plate-shaped substrate with internal electrodes exposed alternately in its both end surfaces was obtained.

A multi-layer piezoelectric actuator that is an electronic component for assessing piezoelectric properties was obtained by forming an external electrode through burning of an Ag paste on both end surfaces of the resultant plate-shaped substrate, and then performing a polarization treatment. In this electronic component, the thickness per layer of the piezoelectric layers (the thickness between the electrodes) of the piezoelectric ceramic plate was 25 μm.

The porosity of the piezoelectric layer was determined by polishing a cross section of the plate-shaped substrate, observing the polished surface by using a scanning electron microscope (SEM), and image processing a photograph of the piezoelectric layer. A SEM photograph of the polished surface thermally etched (in the atmosphere, at 950° C. for 3 hours) was image processed, and the average grain diameter of crystal grains in the piezoelectric layer was determined with the equivalent circle diameter of the cross-sectional area determined from the profile of a crystal grain constituting the piezoelectric layer regarded as the diameter of the crystal grain. As to the density of the piezoelectric layer, the bulk density of the plate-shaped substrate was determined according to the Archimedes method, and the bulk density was regarded as the density of the piezoelectric layer.

The composition of the plate-shaped substrate was examined by ICP emission spectroscopic analysis. It was thereby found that the composition of the piezoelectric layer agreed with the composition used in the preparation within a margin of error.

Figure 7:
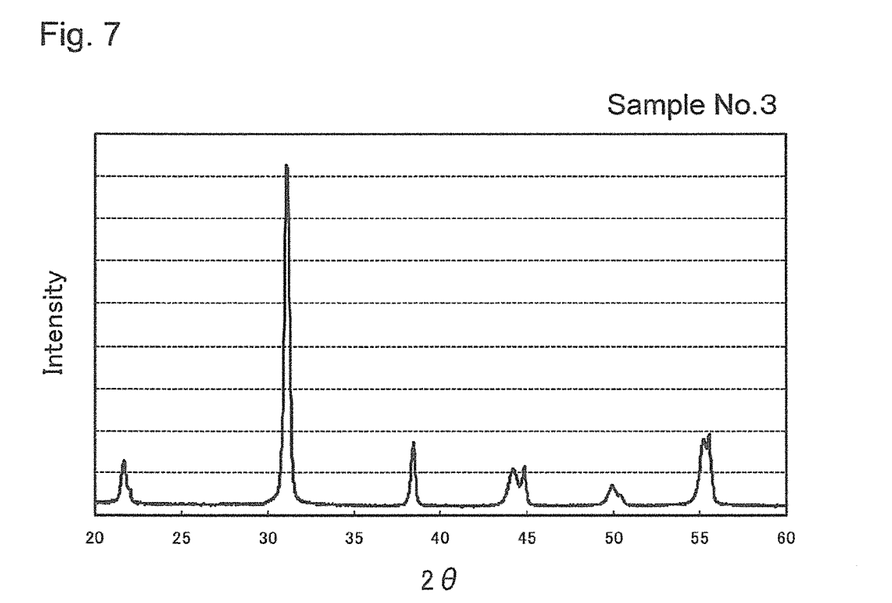
FIG. 7 is a diagram showing the X-ray diffraction result of Sample No. 3.
Figure 8:
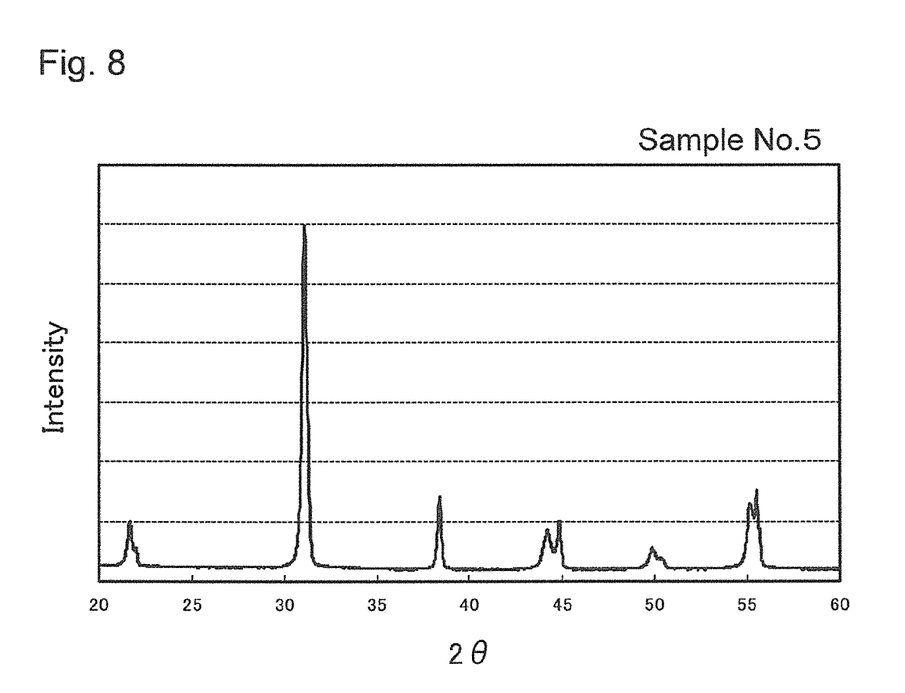
FIG. 8 is a diagram showing the X-ray diffraction result of Sample No. 5.

As to whether there were crystal phases other than the PZT-type crystal in the piezoelectric layer of the piezoelectric ceramic plate, a judgment that there were no crystal phases other than the PZT-type crystal was made when there were substantially no peaks caused by crystals other than the PZT-type crystal peak in the X-ray diffraction (XRD) measurement of the plate-shaped substrate using a Cukα ray. The X-ray diffraction measurement result of Sample No. 3 is shown in FIG. 7 and the X-ray diffraction measurement result of Sample No. 5 is shown in FIG. 8.

The distribution of Bi and Zn of the piezoelectric layer was checked using a transmission electron microscope (TEM). For 10 arbitrary crystal grains, elemental analysis was performed on a crystal grain boundary and at the inside of a crystal grain 10 nm apart from the crystal grain boundary. The results are shown in Table 1. In Table 1, the ratio of the first crystal grains, in which the contents Cb(Zn) and Cb(Bi) of Zn and Bi on a crystal grain boundary are greater than the contents Ci(Zn) and Ci(Bi) of Zn and Bi in the inside of the crystal grain, of the crystal grains measured is shown with errors in measurements taken into account. The average values of Cb(Zn)/Ci(Zn) and Cb(Bi)/Ci(Bi) in the first crystal grains checked were calculated. The results are shown in Table 1.

In the deterioration test of the insulation resistance of a piezoelectric layer, a direct electric field of 2 kV/mm was applied to an electronic component in an isothermal bath at 85° C. The insulation resistance of the electronic component at 85° C. was measured and it was converted into a volume resistivity. A volume resistivity at an early stage of the test and that measured 100 hours later are shown in Table 1.

As to piezoelectric properties, an aging treatment was applied at 100° C. to a polarized electronic component, and then a specimen with a size of 12×3 mm was cut out. The piezoelectric strain constant $d_{31}$ of the electronic component was determined by performing a polarization treatment through application of a DC voltage to two surface electrodes formed on both sides of the specimen, and then measuring a vibration mode in the longitudinal direction. The piezoelectric strain constant $d_{31}$ determined is shown in Table 1.

For the amount of deformation of a piezoelectric ceramic plate, a plate-shaped substrate for deformation measurement was prepared. A 25 μm thick green sheet was prepared by a doctor blade method, and using an internal electrode paste, the internal electrode paste was printed on the whole area of 14.8 mm×28 mm on the green sheet. A green sheet on which the internal electrode paste had not been printed was stacked on the printed side of the green sheet on which the internal electrode paste had been printed, and the stack was subjected to debindering and then fired, thereby yielding a plate-shaped substrate. The firing conditions were the same as the conditions under which the multi-layer piezoelectric actuator was prepared. The plate-shaped substrate obtained was in a rectangular shape having a thickness of 42 μm (the thickness of the piezoelectric layer was 21 μm) and a main surface area of 360 $mm^2$. The deformation of the piezoelectric ceramic plate was assessed with a ratio (ΔL/Lc). The measurement of the length of the piezoelectric ceramic plate was performed using a CNC image measuring device. The results are shown in Table 1.

TABLE 1

| | | | Sample No. | | | | | | |
|---|---|---|---|---|---|---|---|---|---|
| | | | 1 | 2 | 3 | 4 | 5 | 6 | 7 |
| First component*1 | x | — | 0.06 | 0 | 0 | 0 | 0 | 0 | 0 |
| | y | — | 0 | 0.07 | 0.07 | 0.07 | 0.07 | 0.07 | 0.07 |
| | a | — | 0.1 | 0.095 | 0.1 | 0.1 | 0.1 | 0.1 | 0.1 |
| | M | — | Cu | Cu | Cu | Cu | Cu | Cu | Cu |
| | b | — | 0.005 | 0.005 | 0.005 | 0.005 | 0.005 | 0.005 | 0.005 |
| | c | — | 0.465 | 0.435 | 0.43 | 0.425 | 0.425 | 0.425 | 0.425 |
| Calcination condition | Temperature | °C. | 920 | 920 | 920 | 920 | 920 | 920 | 920 |
| | Time | Hr | 3 | 3 | 3 | 3 | 3 | 3 | 3 |
| Additive (Second component) | Kind*2 | — | $Bi_2O_3$: 1 ZnO: 2 | $Bi_2O_3$: 1 ZnO: 2 | BiZnO | $Bi_2O_3$: 1 ZnO: 1 | $Bi_2O_3$: 1 ZnO: 1 | $Bi_2O_3$: 1 ZnO: 1 | $Bi_2O_3$: 3 ZnO: 2 |
| | a*3 | % by mass | 0.5 | 0.5 | 0.5 | 0.1 | 0.5 | 2 | 0.5 |
| Firing condition | Temperature | °C. | 970 | 970 | 970 | 1020 | 970 | 900 | 950 |
| | Time | Hr | 3 | 3 | 3 | 3 | 3 | 3 | 3 |
| Density | | g/cm³ | 7.93 | 7.95 | 7.94 | 7.95 | 7.95 | 7.95 | 7.97 |
| Porosity | | % | 0.22 | 0.15 | 0.13 | 0.18 | 0.14 | 0.03 | 0.12 |
| Average grain diameter | | μm | 2.5 | 2.2 | 2.5 | 2.2 | 2.7 | 4.2 | 2.8 |
| Crystal phase (heterogeneous phase) | Kind | — | None | None | None | None | None | None | None |
| Ratio of first grain | | % | 100 | 80 | 90 | 100 | 90 | 90 | 100 |
| Zn content ratio*4 | Cb/Ci | — | 1.10 | 1.05 | 1.04 | 1.00 | 1.00 | 1.02 | 1.00 |
| Bi content ratio*4 | Cb/Ci | — | 1.06 | 1.00 | 1.06 | 1.01 | 1.07 | 1.08 | 1.07 |
| Volume resistivity | Initial | Ω·m | 95G | 80G | 110G | 95G | 83G | 80G | 90G |
| | 100 Hr later | Ω·m | 95G | 70G | 110G | 94G | 82G | 77G | 89G |
| Piezoelectric properties | d31 | p·m/V | 255 | 295 | 260 | 262 | 265 | 251 | 276 |
| Dielectric constant | | — | 3338 | 3950 | 3600 | 3448 | 3550 | 4010 | 3860 |
| Deformation of ceramic | | % | 0.08 | 0.1 | 0.03 | 0.03 | 0.04 | 0.07 | 0.02 |

| | | | Sample No. | | | | | | |
|---|---|---|---|---|---|---|---|---|---|
| | | | 8 | 9 | 10 | 11 | 12 | 13 | 14 |
| First component*1 | x | — | 0 | 0 | 0 | 0.05 | 0 | 0 | 0 |
| | y | — | 0.07 | 0.07 | 0.07 | 0.02 | 0.07 | 0.07 | 0.07 |
| | a | — | 0.1 | 0.1 | 0.1 | 0.1 | 0.1 | 0.1 | 0.1 |
| | M | — | — | Cu | Ni | Cu | Cu | Cu | Cu |
| | b | — | — | 0.005 | 0.005 | 0.005 | 0.005 | 0.005 | 0.005 |
| | c | — | 0.425 | 0.425 | 0.425 | 0.425 | 0.425 | 0.425 | 0.425 |
| Calcination condition | Temperature | °C. | 920 | 920 | 920 | 920 | 920 | 920 | 920 |
| | Time | Hr | 3 | 3 | 3 | 3 | 3 | 3 | 3 |
| Additive (Second component) | Kind*2 | — | $Bi_2O_3$: 2 ZnO: 1 | $Bi_2O_3$: 2 ZnO: 1 $Sb_2O_3$: 1 | $Bi_2O_3$: 1 ZnO: 2 | BiZnO | $Bi_2O_3$ | None | $Li_2O$: 1 $B_2O_3$: 1 |
| | a*3 | % by mass | 0.5 | 0.4 | 0.5 | 0.5 | 0.5 | None | 0.5 |
| Firing condition | Temperature | °C. | 950 | 970 | 970 | 970 | 970 | 1100 | 990 |
| | Time | Hr | 3 | 3 | 3 | 3 | 3 | 3 | 3 |
| Density | | g/cm³ | 7.98 | 7.96 | 7.96 | 7.96 | 7.93 | 7.95 | 7.84 |
| Porosity | | % | 0.11 | 0.13 | 0.11 | 0.11 | 0.15 | 0.15 | 0.32 |
| Average grain diameter | | μm | 3.1 | 2.7 | 2.3 | 2.4 | 2.5 | 3.2 | 3 |
| Crystal phase (heterogeneous phase) | Kind | — | None | None | None | None | None | None | Amorphous |
| Ratio of first grain | | % | 90 | 100 | 100 | 100 | 0 | 0 | 0 |
| Zn content ratio*4 | Cb/Ci | — | 1.00 | 1.00 | 1.01 | 1.10 | — | — | — |
| Bi content ratio*4 | Cb/Ci | — | 1.08 | 1.01 | 1.01 | 1.06 | — | — | — |
| Volume resistivity | Initial | Ω·m | 80G | 115G | 122G | 120G | 82G | 20G | 30G |
| | 100 Hr later | Ω·m | 77G | 110G | 112G | 120G | 81G | 2.5G | 10M |
| Piezoelectric properties | d31 | p·m/V | 288 | 280 | 256 | 287 | 260 | 277 | 125 |
| Dielectric constant | | — | 3790 | 3780 | 3800 | 3850 | 3500 | 3970 | 2320 |
| Deformation of ceramic | | % | 0.01 | 0.04 | 0.05 | 0.01 | 1.5 | 2.1 | 3.8 |

*1Composition formula $Pb_{1-x-y}Sr_xBa_yTi_{1-a-b-c}(Zn_{1/3}Sb_{2/3})_a(M_{1/3}Nb_{2/3})_bZr_cO_3$
*2A ratio of a plurality of components indicates a molar ratio.
*3α is a mass ratio relative to the first component.
*4Ci is a measured value of the inside of a crystal grain, and Cb is a measured value of an area including a crystal grain boundary.

According to Table 1, Sample Nos. 1 to 11 afford piezoelectric ceramic plates that deform in an amount of 1% or less and can eliminate or reduce the necessity of processing after firing.

Moreover, the samples in which first crystal grains, namely, crystal grains in which the content of at least one of Zn and Bi was larger in crystal grain boundaries adjoining the crystal grains than inside the crystal grains, were present in the piezoelectric layer (Sample Nos. 1 to 11) showed the following results: they were densified to a porosity of 0.25% or less even when they were fired at low temperature; their piezoelectric properties were high and a piezoelectric strain constant $d_{31}$ was 250 p·m/V or more; their initial volume resistivity was 80 GΩ·m or more; the deterioration with time of their insulation resistance was small as indicated by a volume resistivity of 70 GΩ·m or more even after a lapse of 100 hours at 85° C.; and the deformation of a piezoelectric ceramic plate was small. Especially, the samples having a ratio of the first crystal grains of 90% or more had a ratio of the amount of deformation of less than 0.1%. The samples containing Cu in their piezoelectric layers maintained high piezoelectric d constants and had greater coercive electric fields than the samples having similar compositions but containing no Cu.

Example 2

In the same way as Sample No. 5 of Example 1, a first component was prepared, and then a second component was added to the first component. An organic binder was mixed therewith, and then a green sheet was prepared using a doctor blade method. An internal electrode paste was applied to the entire area of this green sheet, and then a green sheet to which an internal electrode paste had not been applied was stacked on the printed surface of the green sheet to which the internal electrode paste had been applied, followed by debindering and subsequent firing. Thus, there was prepared a plate-shaped substrate with a multi-layer structure as illustrated in FIG. 3 having the thickness of a piezoelectric ceramic plate, the area of each of the main surfaces of the piezoelectric ceramic plate, and the thickness of a piezoelectric layer as shown in Table 2.

A plate-shaped substrate depicted in FIG. 5 and having four piezoelectric layers and three internal electrode layers was prepared using three green sheets to each of which an internal electrode paste had been applied partially and one green sheet to which an internal electrode paste had not been applied.

The deformation of the resulting piezoelectric ceramic plate was assessed in the same manner as in Example 1. The results are shown in Table 2.

TABLE 2

| | | Sample No. | | | | |
|---|---|---|---|---|---|---|
| | | 15 | 16 | 17 | 18 | 19 |
| Structure of plate-shaped substrate | | FIG. 3 | FIG. 3 | FIG. 5 | FIG. 5 | FIG. 5 |
| Thickness of piezoelectric ceramic plate | μm | 40 | 40 | 80 | 120 | 120 |
| Thickness of piezoelectric layer | μm | 20 | 20 | 20 | 15 | 15 |
| Main surface area of piezoelectric ceramic plate | mm² | 1200 | 4060 | 42 | 187 | 616 |

TABLE 2-continued

| | | Sample No. | | | | |
|---|---|---|---|---|---|---|
| | | 15 | 16 | 17 | 18 | 19 |
| Deformation of piezoelectric ceramic plate | % | 0.1 | 0.1 | 1.0 | 0.4 | 0.2 |

According to Table 2, Sample Nos. 15 to 19 afford piezoelectric ceramic plates that deform in an amount of 1% or less and can eliminate or reduce the necessity of processing after firing of piezoelectric ceramic plates.

REFERENCE SIGNS LIST

1: Piezoelectric ceramic plate
1c: Main surface
1d: First side surface
1e: Second side surface
2: Crystal grain
5: Internal electrode
7: External electrode
8: Plate-shaped substrate

The invention claimed is:
1. A piezoelectric ceramic plate including a plurality of crystal grains containing a lead zirconate titanate type crystal, comprising a pair of quadrangular main surfaces, a pair of first side surfaces opposing each other, and a pair of second side surfaces opposing each other, wherein the plurality of crystal grains includes first crystal grains having rounded corners and second crystal grains having rounded corners, wherein the pair of first side surfaces includes both the first crystal grains and the second crystal grains, and where the distance between the pair of first side surfaces measured at the center in the longitudinal direction of the first side surfaces is denoted by Lc and the distance between the pair of first side surfaces measured at ends in the longitudinal direction of the first side surfaces is denoted by Le, the ratio of the difference ΔL between Le and Lc to Lc (ΔL/Lc) is 1.0% or less,
wherein a content inside of the first crystal grain includes at least Zn and Bi, and the content of the Zn and Bi inside of the first crystal grain is less than a content of Zn and Bi in an area including a crystal grain boundary adjoining the first crystal grain, and
wherein a content inside of the second crystal grain includes at least Zn and Bi, and the content of the Zn and Bi inside of the second crystal grain is equal to or greater than a content of Zn and Bi in an area including the crystal grain boundary adjoining the second crystal grain.
2. The piezoelectric ceramic plate according to claim 1, wherein the area of each of the main surfaces is 360 mm² or more.
3. The piezoelectric ceramic plate according to claim 1, wherein the area of each of the main surfaces is 1000 mm² or more.
4. The piezoelectric ceramic plate according to claim 1, wherein the piezoelectric ceramic plate has a thickness of 150 μm or less.
5. A plate-shaped substrate comprising the piezoelectric ceramic plate according to claim 1 and an internal electrode within the piezoelectric ceramic plate.
6. An electronic component comprising a surface electrode disposed on a surface of the plate-shaped substrate according to claim 5, and a via hole conductor connected to the internal electrode, extending in the thickness direction of the piezoelectric ceramic plate, and led to the surface of the plate-shaped substrate.

7. An electronic component comprising the plate-shaped substrate according to claim 5, and an external electrode disposed on each of the second side surfaces of the piezoelectric ceramic plate and connected to the internal electrode, wherein the electronic component has a processed surface as each of the second side surfaces of the piezoelectric ceramic plate, and the external electrode is disposed on the processed surface.

* * * * *